(12) United States Patent
Dewar

(10) Patent No.: US 8,196,215 B2
(45) Date of Patent: Jun. 5, 2012

(54) SECURITY CIRCUIT FOR POWER UP

(75) Inventor: Kevin Dewar, Bristol (GB)

(73) Assignee: Icera Inc., Wilmington, DE (US)

( * ) Notice: Subject to any disclaimer, the term of this patent is extended or adjusted under 35 U.S.C. 154(b) by 691 days.

(21) Appl. No.: 12/328,952

(22) Filed: Dec. 5, 2008

(65) Prior Publication Data

US 2009/0158445 A1 Jun. 18, 2009

(30) Foreign Application Priority Data

Dec. 14, 2007 (GB) .................................. 0724422.1

(51) Int. Cl.
*G06F 17/30* (2006.01)
*G06F 11/00* (2006.01)
(52) U.S. Cl. ................................ 726/34; 726/2; 726/26
(58) Field of Classification Search ....................... 726/34
See application file for complete search history.

(56) References Cited

U.S. PATENT DOCUMENTS

| 5,309,037 | A |  | 5/1994 | Curley et al. |
| 5,454,113 | A |  | 9/1995 | Graf et al. |
| 5,600,818 | A |  | 2/1997 | Weikmann |
| 6,065,073 | A | * | 5/2000 | Booth ........................... 713/100 |
| 6,145,085 | A | * | 11/2000 | Tran et al. ........................ 726/5 |
| 6,282,611 | B1 | * | 8/2001 | Hamamoto et al. ............. 380/53 |
| 6,480,097 | B1 | * | 11/2002 | Zinsky et al. .................... 726/17 |
| 2005/0105348 | A1 |  | 5/2005 | Tanaka et al. |
| 2011/0299678 | A1 | * | 12/2011 | Deas et al. ....................... 380/28 |

FOREIGN PATENT DOCUMENTS

| EP | 1724924 | 11/2006 |
| GB | 0724422.1 | 3/2009 |

OTHER PUBLICATIONS

Representing Negative Numbers: Two's Complement, Published Notes from Northeastern University's CSU200 Discrete Structures Profs. Aslam & Fell Fall 2005; Oct. 27, 2005.*

* cited by examiner

*Primary Examiner* — David Y Jung
(74) *Attorney, Agent, or Firm* — Ryan, Mason & Lewis, LLP

(57) ABSTRACT

A circuit and method for securing against non-reset of a device associated with the circuit, the circuit comprising: a first register for holding a first multi-bit value and to produce a first multi-bit output value related to the first multi-bit value; a second register for holding a second multi-bit value and to produce a second multi-bit output value related to the second multi-bit value; an inverter means arranged to invert only one of the first and second output values; and a comparator arranged to compare the inverted and non-inverted output values to produce a comparator output, wherein the first and second registers are arranged such that they are subject to substantially the same operational conditions.

15 Claims, 2 Drawing Sheets

//<br>
SECURITY CIRCUIT FOR POWER UP

Priority Claim

The present application claims the priority of Great Britain Patent Application No. 0724422.1 filed Dec. 14, 2007.

FIELD OF THE INVENTION

This invention relates to security of a chip and in particularly to security at power-up of the chip.

BACKGROUND OF THE INVENTION

It is common to provide scan and debug features for chips carrying electronic circuits. The purpose of scanning a chip is to check it has been manufactured correctly and does not contain unintended short circuits or logic errors. Debugging is used in development of a prototype chip to correct any errors before mass manufacture. Although these features are extremely useful in developing a working chip, they have a disadvantage in that they allow access to other chip features or data which are considered secure i.e. should not be available or visible in deployed devices.

Devices containing such chips are commonly arranged such that when the device is powered up, a reset procedure is carried out. This puts the chip in a known state from which various user authentication procedures can be safely and correctly run. However, by tampering with a chip, it can be possible to bypass the authentication procedures or cause them to run incorrectly, thereby putting the chip in a state where it thinks it has been authenticated but has not been. Thus an unauthorised user could access secure features or data. In other words the chip can be attacked by powering it up but not resetting it.

Power-up reset circuits as known in the art can be used to avoid this scenario, by attempting to ensure that a reset always occurs. One disadvantage of such circuits is that for various reasons they are somewhat difficult circuits to implement on standard digital chips. For example, the necessary voltage may not be available on the chip, and the silicon area may not be adequate. Another disadvantage of such circuits is that they are themselves open to various attacks based upon control of chip power supplies. For example, tampering using a controlled voltage ramp can cause the power-on reset circuit to not work correctly.

Therefore it would be desirable to provide a circuit which will begin in a secure mode after power-up, whether reset or not and regardless of whether attempts are made to compromise security by tampering with reset or power supplies. Such a circuit would enable authentication to be started from a secure known condition such that the authentication procedure would work correctly and could not be bypassed.

SUMMARY OF THE INVENTION

According to a first aspect of the invention, there is provided a circuit for securing against non-reset of a device associated with the circuit, the circuit comprising : a first register for holding a first multi-bit value and to produce a first multi-bit output value related to the first multi-bit value; a second register for holding a second multi-bit value and to produce a second multi-bit output value related to the second multi-bit value; an inverter means arranged to invert only one of the first and second output values; and a comparator arranged to compare the inverted and non-inverted output values to produce a comparator output, wherein the first and second registers are arranged such that they are subject to substantially the same operational conditions.

In use of the circuit for securing against non-reset, the first and second multi-bit values are the same.

The inverter means are important to ensure that: (i) if a reset occurs the two inputs to the comparator are completely different; (ii) if a reset has not occurred, the two inputs to the comparator are highly likely to be different, even if the un-reset registers themselves have a tendency to power-up in a similar way (which they are likely to in a situation where the cells that comprise the registers are similar to each other).

According to a second aspect of the invention, there is provided a method of resetting a circuit associated with a device, comprising the steps of: loading each of a first and second register which are subject to substantially the same operational conditions with the same multi-bit value; producing a first multi-bit output value related to the multi-bit value from the first register; producing a second multi-bit output value related to the multi-bit value from the second register; inverting only one of the first and second output values; and comparing the inverted and non-inverted output values to provide an indication that the device is in secure mode.

According to a third aspect of the invention there is provided a method of indicating a secure state of a circuit associated with a device without resetting on power-up of the circuit, comprising the steps of: allowing a first register to settle to a first multi-bit value and produce a first multi-bit output value related to the first multi-bit value; allowing a second register to settle to a second multi-bit value and produce a second multi-bit output value related to the second multi-bit value; inverting only one of the first and second output values; and comparing the inverted and non-inverted output values to produce a comparator output, wherein the first and second registers are arranged such that they are subject to substantially the same operational conditions and thereby tend to settle to the same multi-bit values.

The invention further provides a device comprising a circuit of the type described above.

Embodiments of the invention will now be described, by way of example only, with reference to the accompanying drawings.

BRIEF DESCRIPTION OF THE DRAWINGS

In the figures like reference numerals indicate like parts.

DETAILED DESCRIPTION OF THE PREFERRED EMBODIMENTS

The following described embodiment of the invention comprises a circuit for comparing the values of two similar registers, both of which are reset into the same state, but where one of the values in the comparison is the inverse of one of the registers. The embodiment will now be described in more detail with reference to the figures.

Figure 1:
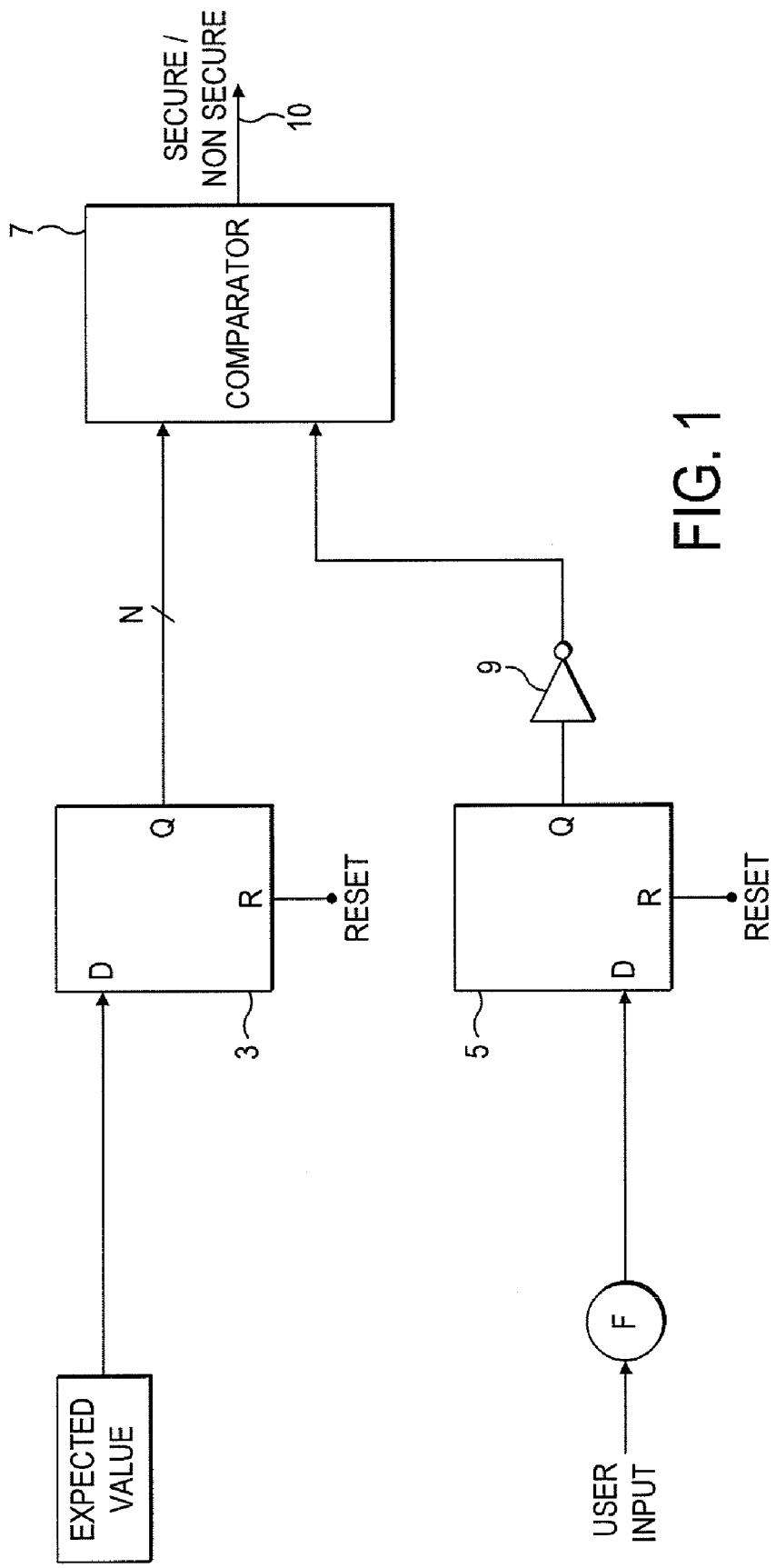
FIG. 1 shows a circuit in accordance with an embodiment of the invention.

FIG. 1 shows a circuit 1 suitable for use in place of a standard anti-tamper circuit on a chip to avoid the need for the usual power-on-reset procedure. The circuit comprises a first register 3 and a second register 5. These registers each have three inputs and one output as known in the art. The inputs are data (D), clock (clk) and reset (R). The output is denoted by Q. The registers 3, 5 are of the same width, N bits, where N is 16 bits. Thus the output wires from the two registers 3, 5 are marked with an "N" to indicate that the registers and wires as drawn are N bits wide. It will be appreciated by those skilled in the art that the width of the registers can be varied and another suitable width would be 32 bits but other amounts could be used. The width denotes the number of bits in the value stored in each register.

The input to the first register 3 is shown as being a set of expected bits. The input to the second register 5 is shown as being a function f of a user input. The output of the first register 3 provides a first input to a comparator 7. The output of the second register 5 passes into an inverter 9, the output of which forms a second input to the comparator 7. The inverter 9 inverts each bit of a multi-bit output value. Thus as previously explained, the input to the comparator 7 is multi-bit (N bits) although only one input wire is shown in the figure. The output of the comparator is denoted by reference numeral 10.

The chip on which the circuit 1 is located for providing reset protection will be in a secure state until an authentication procedure has been completed. On power-up, the user will be asked for a user input, and this, having been processed by the function f provides the input to the second register 5. The chip stores a set of expected bits, as mentioned above, which are expected to match the user input after the appropriate function has been applied to the user input. These expected bits form the input to the first register 3. Thus, assuming the user input is correct, the same multi-bit value is applied to both registers 3, 5 for a normal reset procedure, as will now be explained.

In normal operation, upon power up of the circuit, a normal, intended reset procedure occurs. This means that the expected bits are loaded into the first register 3 and the processed user input is loaded into the second register 5. The output of the first register 3 is in this embodiment identical to its input and the output provides a first multi-bit input to the comparator 7. The output of the second register 5 is similarly related to its input and this output is inverted before being fed to the comparator 7 as the second input to the comparator 7. It would be possible to use a different type of register which applied some function to its inputs so that the inputs and outputs were not identical but related by a function. The comparator 7 compares respective bits of its two multi-bit input values and looks for equality of its inputs. In this embodiment all 16 bits are compared in parallel, and the output of the comparator is a single bit indicating equality or not. Assuming that the user put in the correct input, since the two registers 3, 5 were loaded with the same set of values, no bits in the comparison match. The output from the comparator indicates that the state of the circuit is known and is in a secure mode.

If an attack is made to the circuit 1 whereby the above-described normal reset procedure is not activated, due to the normal properties of the registers 3, 5, all the bits in the registers 3, 5 will power-up in an undefined state. However, each bit in the registers 3, 5 will nonetheless tend to exhibit a tendency to have a bias towards one particular logical state (zero or one). Because the output of one of the registers is inverted, the bits being compared by the comparator 7 will still tend to be the opposite of each respective other because the self-similarity of all the register cells in the circuit will mean that the true and inverted version of these register bits will tend to be maximally different. This is the case for different designs of chip, process variation, temperature, voltage variation and localized silicon variation because all cells in both registers 3, 5 are essentially identical and have been subject to almost identical effects. One reason for the cells in the registers being subject to almost identical effects and operational conditions is that in practice the two registers are likely to be located in close enough proximity to each other for that to be the case.

Thus even if an attempt has been made to tamper with the circuit which has somehow prevented the same stored bits being input to both registers 3, 5 it is highly likely that the reset procedure will nevertheless produce the same known state that would have been produced in a normal reset procedure. In other words the circuit 1 is able to negate the effect of such an attack by self-resetting itself in a known state. Thus in this situation the circuit is also in a secure mode.

Even in the worst-case scenario where every single bit of each register has an exactly equal probability of initializing in either state, the probability of the circuit generating a false match is 1 in 2N where N=width of the registers. In other words, there is a very low probability that any register bit would, when compared with its inverse, generate a match (logical one) which would indicate an insecure state.

In practice, over multiple devices and multiple power-up events, the actual probability of a false match would be very significantly lower and therefore insignificant in comparison to the advantages of the circuit. It will also be appreciated by those skilled in the art that the circuit 1 is advantageous over comparing a register against a fixed value because the latter can offer no better than a 1 in 2N false match probability in any scenario. By contrast, the invention will generally (other than a worst-case scenario) have a much lower probability of a false match. Therefore the inventive circuit provides an advantage over prior art anti-tamper circuits in that the probability of a false match is significantly reduced for a small hardware cost.

Once in a known state following either normal reset or self-reset a user authentication procedure can be carried out. The nature of this authentication procedure depends on the particular chip which the circuit 1 is protecting but it uses the expected value and the user input as described above. In other words, the inventive circuit makes use of expected stored and user input values of the authentication procedure, which is efficient in terms of time spent by the user inputting pass codes etc. It should be appreciated though, that if desired, other stored values could be used as input to the registers. The same set of stored values could be used to input to both registers.

If the authentication procedure is successful, the user is authenticated. In this case, secure features of the chip are enabled. On the other hand, if incorrect values have been input by a user, the user will not be authenticated. The correct authentication procedure can be carried out in view of the fact that the circuit has reset. Thus secure features of the chip will not be enabled.

A further advantage of the inventive circuit is that it allows use of EFUSE (IBM technology which allows dynamic reprogramming of chips and which is convenient for many purposes and commonly available). EFUSE is not inherently high-security (it can be tampered with) but in conjunction with multi-use Cyclic Redundancy Check (CRC) scheme allows highly secure access to critical security features such as scan and debug. More than one phase of EFUSE programming can be supported, each requiring its own CRC value. The EFUSE technology is used to store the multi-bit expected value for use in the inventive reset procedure described above. Thus this technology can be used for the authentication procedure of a chip which the inventive circuit 1 is protecting.

Figure 2:
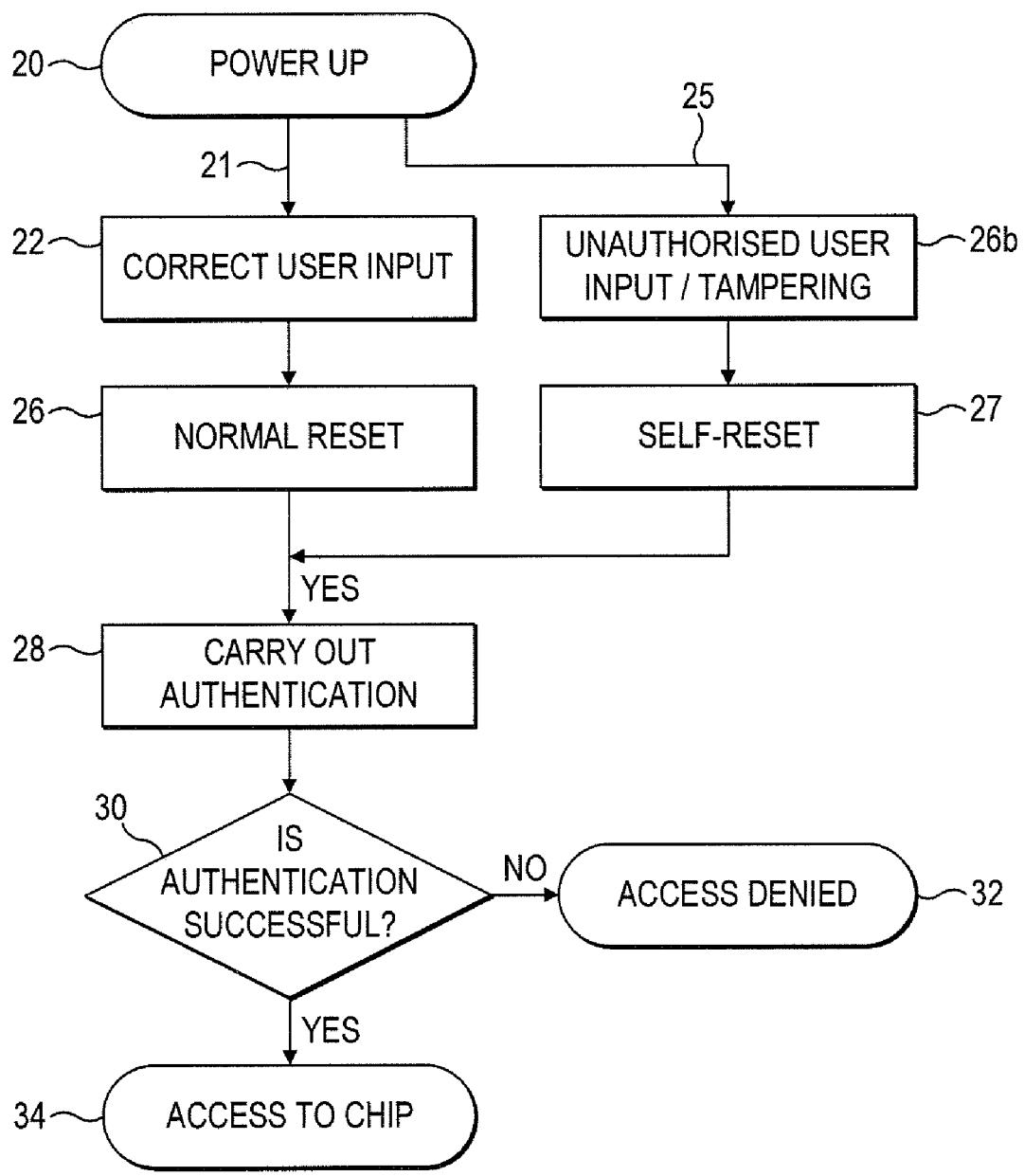
FIG. 2 is a flow chart showing steps of an embodiment of the invention.

Turning now to FIG. 2, the process steps of an embodiment of the invention are set out for clarification. In step 20, power is provided to the circuit 1. From this point, there is an expected path 21 and an unexpected path 25. If the expected path is followed, correct user input is received at step 22. At step 23, a function is applied to the received user input to calculate the multi-bit value for input to the second register 5. The circuit 1 then carries out the above-described normal reset procedure by loading the register 3 with the stored expected multi-bit value and the register 5 with the calculated multi-bit value. This is step 26a. Alternatively, the unexpected path 25 is followed. In this case, an unauthorised user input is received and/or some sort of tampering occurs to the chip. This is shown at step 26b. However, due to the nature of the circuit 1 as previously explained, this path nevertheless leads to self-reset of the circuit. This self-reset is shown at step 27.

Both the normal reset procedure step 24 and the self-reset procedure 27 lead to the next step 28, which is authentication. At step 30, it is determined whether the authentication procedure has been successful. If the answer is no, access to the chip is denied at step 32. This could be done by disabling power to other parts of the chip. If the answer is yes, power is provided to the chip and therefore secure features of the chip can be accessed.

It will be understood that some modifications could be made to the circuit 1 within the scope of the invention. For example, the inverter 9 could be positioned on the output of the first register 3 instead of on the second register 5. Furthermore, the circuit 1 could be used to protect a single chip in an electronic device or alternatively it could be used to protect one of a number of chips on a larger circuit board, all of which could be powered up only after the described reset and authentication procedures.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

What is claimed is:

1. A circuit for securing against non-reset of a device associated with the circuit, the circuit comprising:
    a first register for holding a first multi-bit value and to produce a first multi-bit output value related to the first multi-bit value;
    a second register for holding a second multi-bit value and to produce a second multi-bit output value related to the second multi-bit value;
    an inverter coupled to receive as an input only one of the first and second multi-bit output values and invert the input to output an inverted multi-bit output value wherein each bit is the inverse of the input; and
    a comparator arranged to compare the inverted and non-inverted multi-bit output values to produce a comparator output indicating a match or mismatch between the inverted and non-inverted output values,
    wherein the first and second registers are arranged such that they are subject to substantially the same operational conditions.

2. A circuit according to claim 1, wherein if the comparator output indicates that the first and second multi-bit values are the same, the device is in a secure mode and if the comparator output indicates that the first and second multi-bit values are not the same, the device is in a non-secure mode.

3. A circuit according to claim 1, wherein the first and second registers are located in close proximity to one another so as to be subject to substantially the same operational conditions.

4. A circuit according to claim 1, wherein the comparator is arranged to compare the respective multi-bit inverted and non-inverted output values substantially in parallel.

5. A circuit according to claim 1, wherein the first register is arranged to be loaded with the first multi-bit value and the second register is arranged to be loaded with the second multi-bit value, the first and second multi-bit values being identical.

6. A circuit according to claim 1, wherein one of the first and second multi-bit values is a function of a user input to the device and the other of the first and second multi-bit values is a stored value.

7. A method of resetting a circuit associated with a device, comprising the steps of:
    loading each of a first and second register which are subject to substantially the same operational conditions with the same multi-bit value;
    producing a first multi-bit output value related to the multi-bit value from the first register;
    producing a second multi-bit output value related to the multi-bit value from the second register;
    receiving as an input only one of the first and second multi-bit output values;
    inverting the input to output an inverted multi-bit output value wherein each bit is the inverse of the input; and
    comparing the inverted and non-inverted output values to provide an indication that the device is in secure mode.

8. A method according to claim 7, wherein the first and second registers are located in close proximity to one another so as to be subject to substantially the same operational conditions.

9. A method according to claim 7, wherein the step of comparing all the respective inverted and non-inverted multi-bit output values is carried out substantially in parallel.

10. A method of indicating a secure state of a circuit associated with a device without resetting on power-up of the circuit, comprising the steps of:
    allowing a first register to settle to a first multi-bit value and produce a first multi-bit output value related to the first multi-bit value;
    allowing a second register to settle to a second multi-bit value and produce a second multi-bit output value related to the second multi-bit value;
    receiving as an input only one of the first and second multi-bit output values;
    inverting the input to output an inverted multi-bit output value wherein each bit is the inverse of the input; and
    comparing the inverted and non-inverted output values to produce a comparator output indicating a match or mismatch between the inverted and non-inverted output values,
    wherein the first and second registers are arranged such that they are subject to substantially the same operational conditions and thereby tend to settle to the same multi-bit values.

11. A method according to claim 10, wherein the first and second registers are located in close proximity to one another so as to be subject to substantially the same operational conditions.

12. A method according to claim 10, wherein the step of comparing all the respective inverted and non-inverted multi-bit output values is carried out substantially in parallel.

13. A device comprising a circuit for securing against non-reset of a device associated with the circuit, the circuit comprising:
- a first register for holding a first multi-bit value and to produce a first multi-bit output value related to the first multi-bit value;
- a second register for holding a second multi-bit value and to produce a second multi-bit output value related to the second multi-bit value;
- an inverter coupled to receive as an input only one of the first and second multi-bit output values and invert the input to output an inverted multi-bit output value wherein each bit is the inverse of the input; and
- a comparator arranged to compare the inverted and non-inverted multi-bit output values to produce a comparator output indicating a match or mismatch between the inverted and non-inverted output values, wherein the first and second registers are arranged such that they are subject to substantially the same operational conditions.

14. A device according to claim 13, comprising a memory for storing the first and second multi-bit values to be loaded into the first and second registers.

15. A device according to claim 13, wherein the first and second registers are located in close proximity to one another so as to be subject to substantially the same operational conditions.

* * * * *